United States Patent
Song et al.

(10) Patent No.: US 7,601,419 B2
(45) Date of Patent: Oct. 13, 2009

(54) PRINTED CIRCUIT BOARD AND METHOD OF MANUFACTURING THE SAME

(75) Inventors: Jong Seok Song, Seoul (KR); Taehoon Kim, Gyeonggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 255 days.

(21) Appl. No.: 11/585,276

(22) Filed: Oct. 24, 2006

(65) Prior Publication Data

US 2007/0141310 A1   Jun. 21, 2007

(30) Foreign Application Priority Data

Dec. 19, 2005   (KR) ...................... 10-2005-0125249
Jul. 6, 2006    (KR) ...................... 10-2006-0063370

(51) Int. Cl.
*B32B 15/00* (2006.01)

(52) U.S. Cl. ...................... 428/209; 174/257; 174/258; 174/259; 361/750; 361/751

(58) Field of Classification Search ................. 428/209; 174/258, 257–259; 361/750–751
See application file for complete search history.

(56) References Cited

U.S. PATENT DOCUMENTS

| | | | | |
|---|---|---|---|---|
| 4,689,110 A | * | 8/1987 | Leibowitz | ...................... 216/20 |
| 4,895,752 A | * | 1/1990 | McEwen | ...................... 442/233 |
| 6,630,743 B2 | * | 10/2003 | Magnuson et al. | .......... 257/774 |
| 6,881,991 B2 | | 4/2005 | Aoyama et al. | |

FOREIGN PATENT DOCUMENTS

| | | | | |
|---|---|---|---|---|
| GB | 2109166 A | * | 5/1983 | |
| JP | 07-323501 A | | 12/1995 | |
| JP | 09-003220 A | | 1/1997 | |
| JP | 2001-251040 A | | 9/2001 | |
| JP | 2004-152915 A | | 5/2004 | |
| KR | 1998-068853 | | 10/1998 | |
| KR | 2002-0028597 | | 4/2002 | |

OTHER PUBLICATIONS

Korean Intellectual Property Office—Office Action dated May 15, 2007 and issued in corresponding Korean Patent Application No. 10-2006-0063770.

Japanese Office Action issued on Apr. 14, 2009 in corresponding Japanese Patent Application 2006-340387.

* cited by examiner

*Primary Examiner*—Cathy Lam

(57) ABSTRACT

Disclosed are a printed circuit board and a method of manufacturing the same, in which a fluorine resin coating layer is formed on a resin substrate, and then a copper layer is formed using a dry process including ion beam surface treatment and vacuum deposition instead of a conventional wet process including surface roughening and electroless copper plating. According to this invention, the interfacial adhesion of the substrate material may be increased without changing the surface roughness thereof, thus realizing a highly reliable fine circuit. As well, a low dielectric constant and a low loss coefficient may be obtained thanks to the formation of the fluorine resin layer. Further, a wet process is replaced with a dry process, whereby the copper plating layer may be formed in an environmentally friendly manner.

5 Claims, 12 Drawing Sheets

PRINTED CIRCUIT BOARD AND METHOD OF MANUFACTURING THE SAME

CROSS REFERENCE TO RELATED APPLICATION(S)

This application claims the benefit of Korean Patent Application No. 2005-125249, entitled "Printed circuit board and preparing method thereof", filed Dec. 19, 2005, and of Korean Patent Application No. 2006-63370, entitled "Printed circuit board and preparing method thereof", filed Jul. 6, 2006, which are hereby incorporated by references in their entirety into this application.

BACKGROUND OF THE INVENTION

1. Field of the Invention

The present invention relates to a printed circuit board (PCB) and a method of manufacturing the same. More particularly, the present invention relates to a PCB, in which a hydrophilic fluorine resin coating layer is formed on a resin substrate and a dry plating process is performed instead of a conventional wet plating process, thus obtaining a highly reliable fine circuit, and to a method of manufacturing such a PCB.

2. Description of the Related Art

Presently, PCBs are manufactured using a subtractive process, an MSAP (Modified Semi-Additive Process), or an SAP (Semi-Additive Process).

In particular, a subtractive process is applied to HDI (High Density Interconnection) products, and a subtractive process and an MSAP are used for a UT-CSP (Ultra Thin-Chip Scale Package) and a BGA (Ball Grid Array). In FCBGA (Flip Chip BGA), a subtractive process is applied to a core layer and an SAP is applied to an outer layer, including 2F2B/3F3B (build-up), and further, a seed layer is formed through electroless plating, leading to a fine circuit.

In this regard, the process of manufacturing the PCB according to a first conventional technique is shown in the flowchart of FIG. 1.

Referring to FIG. 1, the method of manufacturing the PCB according to the first conventional technique comprises providing a double-sided copper clad laminate (S101), making a hole (S102), performing desmearing (S103), performing electroless copper plating (S104), performing copper panel electroplating (S105), applying a dry film (S106), performing exposure and development (S107), performing etching (S108), and removing the dry film (S109).

Below, the method of manufacturing the PCB using a subtractive process according to the first conventional technique is specifically described with reference to FIGS. 2A to 2F.

A copper clad laminate (CCL), having a resin insulating layer 11 and copper foils 12 on both surfaces thereof, is prepared and is then subjected to typical etching and drilling to thus form a through hole 13 therein (FIGS. 2A and 2B). Subsequently, the surface of the substrate having the through hole 13 is desmeared, after which an electroless copper layer 14 is formed through electroless plating (FIG. 2C) and a copper panel plating layer 15 is formed through electroplating (FIG. 2D). Then, a dry film 16 is applied on the part of the copper layer that corresponds to a circuit pattern having the through hole 13 (FIG. 2E), and the other unnecessary copper parts are removed through exposure and development, followed by removing the dry film 16, thereby completing the patterning procedure (FIG. 2F).

In addition, the process of manufacturing the PCB according to a second conventional technique is shown in the flowchart of FIG. 3.

As shown in FIG. 3, the method of manufacturing the PCB according to the second conventional technique comprises providing a double-sided CCL (S201), performing half-etching (S202), making a hole (S203), performing desmearing (S204), performing electroless copper plating (S205), applying a dry film (S206), performing exposure and development (S207), performing copper pattern electroplating (S208), removing the dry film (S209), and performing flash etching (S210).

Below, the method of manufacturing the PCB through MSAP according to the second conventional technique is specifically described with reference to FIGS. 4A to 4F.

A CCL, having a resin insulating layer 21 and copper foils 22 on both surfaces thereof, is half-etched (FIG. 4A), and is then subjected to typical etching and drilling to thus form a through hole 23 therein (FIG. 4B). Subsequently, the surface of the substrate having the through hole 23 is desmeared, after which an electroless copper layer 24 is formed through electroless plating (FIG. 4C). A dry film 26 is applied on the part of the copper layer, with the exception of a circuit pattern having the through hole 23 (FIG. 4D). Using such a dry film as a resist, a copper pattern plating layer 27 is formed through electroplating (FIG. 4E). Thereafter, the dry film 26 is removed, and unnecessary copper parts are removed through flash etching, thereby completing the patterning procedure (FIG. 4F).

As such, although the material for the resin insulating layer is typically exemplified by epoxy resin, such as FR-4, BT (Bismaleimide Triazine), or ABF (Ajinomoto Build up Film), it is disadvantageous because it has a high dielectric constant (Dk>3.5[ABF]~4.5[BT, FR-4]) and a high loss coefficient (Df>0.05), and undesired signal transfer rate and transfer loss are caused, consequently generating heat and deteriorating electrical properties.

For example, in the case of BGA or UT-CSP products through a subtractive process and MSAP using BT insulating material, the surface profile of the material is 1 μm or more, and L/S (line/Space) is limited to a minimum circuit width of 50/50 μm in the subtractive process. On the other hand, in MSAP, variation in the thickness of the copper layer occurs due to half-etching, therefore L/S is limited to a minimum circuit width of 25/25 μm. Ultimately, a fine circuit having a pitch of less than 50 μm (L/S=25/25 μm) is difficult to realize.

Further, in the group of FCBGA products, a multilayered substrate is manufactured through SAP using ABF insulating material. That is, as shown in FIG. 5, a core layer (which is composed of $1^{st}$ and $2^{nd}$ layers) is formed through a subtractive process, and outer layers (which are composed of $3^{rd}$ to $6^{th}$ layers) are formed through SAP, including electroless plating for the formation of a plating layer 1~3 μm thick, circuit formation, electroplating, stripping, and flash etching, which are repeated two times. Thereby, through holes 33 and circuit patterns 32a, 32b, 35a, 35b, 37a, 37b are formed in resin insulating layers 31, 34a, 34b, 36a, 36b. Further, solder resists 38a, 38b are applied, and solder resist open parts 39a, 39b are formed, thereby manufacturing a FCBGA substrate having a total of six layers.

However, due to the use of expensive ABF material, the process cost is increased, leading to a high production price. In the case where SAP is used, since the surface profile of the ABF material is 1 μm or greater, the surface roughness is large and the pitch (line/space) is 18/18 μm. Furthermore, a fine circuit is difficult to realize, attributable to wet surface treatment and electroless chemical plating.

With the demand for light, slim, short and small PCBs, various manufacturers have developed insulating materials for realizing a fine circuit and exhibiting high functionality to thus increase the signal transfer rate of the circuit. In the present development trend, since the input and output of signals are increased, the circuit is required to be fine. Accordingly, among high functional insulating materials, insulating material having a low dielectric constant and a low loss coefficient, such as PTFE (PolyTetraFluoroEthylene), PI (PolyImide), LCP (Liquid Crystal Polymer), bonding sheet, or TPI (Thermoplastic PolyImide), is used to increase the signal transfer rate. In addition, the surface roughness of the material is controlled to 0.5 µm or less so as to enable the formation of a fine circuit even when using SAP. However, in the conventional SAP, since the copper layer is formed through a wet process such as wet surface treatment and electroless plating, the surface roughness is enlarged, and the formation of the fine circuit is limited. As well, a lot of waste is generated, therefore the above process is considered environmentally unfriendly.

SUMMARY OF THE INVENTION

Leading to the present invention, intensive and thorough research on PCBs, carried out by the present inventors aiming to avoid the problems encountered in the related art, led to the development of a PCB for realizing a highly reliable fine circuit by forming a hydrophilic fluorine resin coating layer on a resin substrate and then forming a copper layer through a dry process.

Accordingly, an object of the present invention is to provide a PCB, in which interfacial adhesion of a resin substrate is increased without changing the surface roughness thereof, thus forming a highly reliable fine circuit, and also a method of manufacturing such a PCB.

Another object of the present invention is to provide a PCB, having a low dielectric constant and a low loss coefficient, and also a method of manufacturing such a PCB.

A further object of the present invention is to provide a PCB, which may be manufactured in an environmentally friendly manner by replacing a typical wet copper plating process with a dry copper plating process, and also a method of manufacturing such a PCB.

In order to accomplish the above objects, the present invention provides a method of manufacturing a PCB, comprising (a) providing a resin substrate for the PCB; (b) coating at least one surface of the resin substrate with fluorine resin; (c) forming at least one via hole for interlayer electrical connection in the substrate coated with the fluorine resin; (d) surface treating the substrate having the via hole using ion beams; (e) forming a copper seed layer on the surface treated substrate using a vacuum deposition process; (f) plating the substrate having the copper seed layer with a copper pattern to thus form a copper pattern plating layer; and (g) removing part of the copper seed layer on which the copper pattern plating layer is not formed.

As such, the fluorine resin may be selected from the group consisting of polytetrafluoroethylene (PTFE), polyimide (PI), liquid crystal polymer (LCP), thermoplastic polyimide (TPI), fluorinated ethylene propylene (FEP), perfluoroalkoxy (PFA), ethylene-tetrafluoroethylene (ETFE), polyvinylidene fluoride (PVDF), ethylene-chlorotrifluoroethylene (ECTFE), polychlorotrifluoroethylene (PCTFE), and combinations thereof.

Preferably, the coating with the fluorine resin is performed by applying a liquid fluorine resin on the substrate and then heat treating it at 100~450° C. In this case, the application of the fluorine resin and the heat treatment thereof may be repeated one to ten times. Further, the coating with the fluorine resin may be performed in a sheet manner or a roll-to-roll manner.

Preferably, the surface treating using the ion beams is performed in the presence of an inert gas selected from the group consisting of Ar, $O_2$, $N_2$, Xe, $CF_4$, $H_2$, Ne, Kr, and mixtures thereof.

Preferably, the vacuum deposition process is sputtering, thermal evaporation, or e-beam.

The fluorine resin coating layer preferably has a thickness from 20 nm to 10 µm, and the copper seed layer preferably has a thickness from 20 nm to 4 µm.

The resin substrate may be a substrate composed of epoxy resin or fluorine resin.

In addition, the present invention provides a PCB, comprising (a) a resin substrate for the PCB; (b) a fluorine resin coating layer formed on at least one surface of the resin substrate; (c) a via hole formed in a predetermined position of the substrate coated with the fluorine resin; (d) a copper seed layer formed on the surface of the substrate having the via hole through ion beam surface treatment and vacuum deposition; and (e) a copper pattern plating layer formed on part of the substrate having the copper seed layer and formed in the via hole.

DESCRIPTION OF THE PREFERRED EMBODIMENTS

Hereinafter, a detailed description will be given of the present invention, with reference to the appended drawings.

Upon fabrication of a PCB according to the present invention, a conventional wet process, including surface roughening and electroless plating, is replaced with a dry process, thus adhesion is assured without a rough surface profile, realizing a fine circuit in an environmentally friendly manner.

Figure 1:
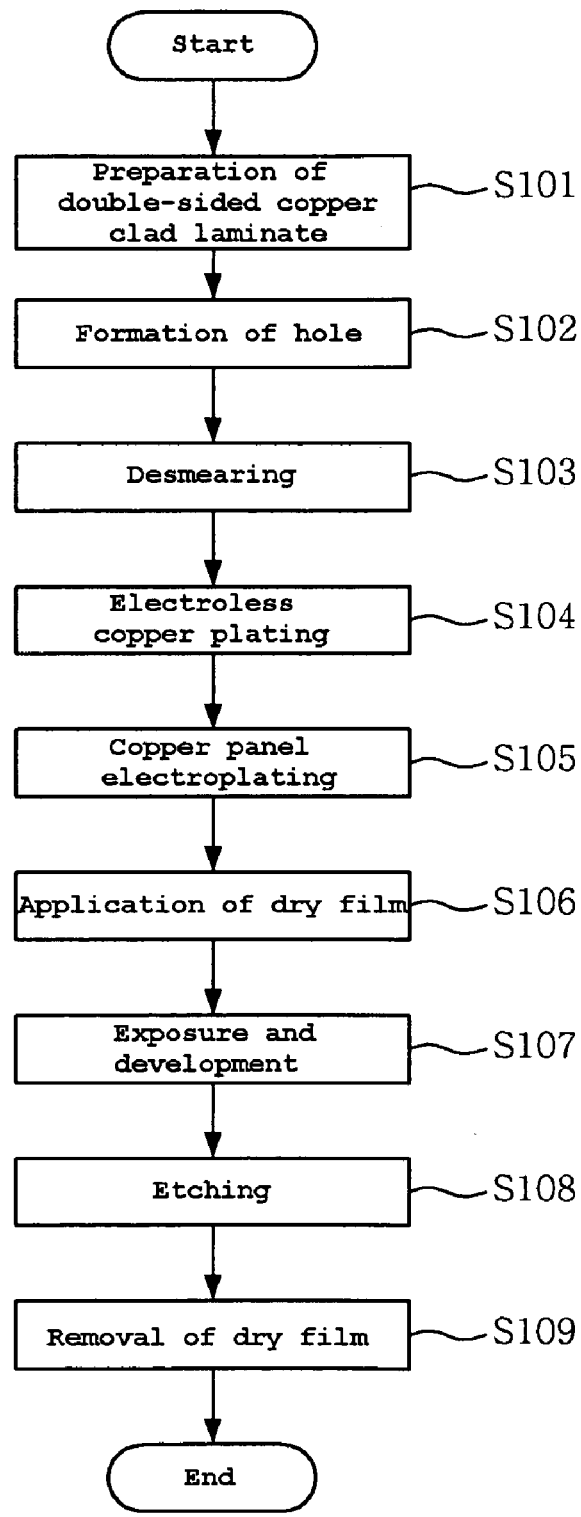
FIG. 1 is a flowchart schematically showing the process of manufacturing a PCB according to a first conventional technique.
Figure 2A:
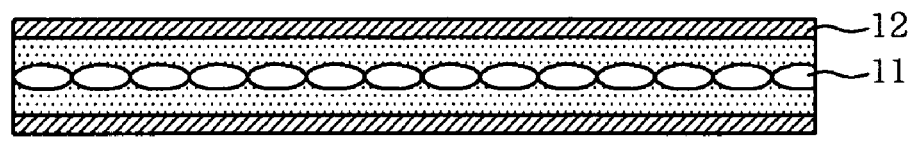
FIGS. 2A to 2F are schematic views sequentially showing the process of manufacturing the PCB according to the first conventional technique.
Figure 2B:
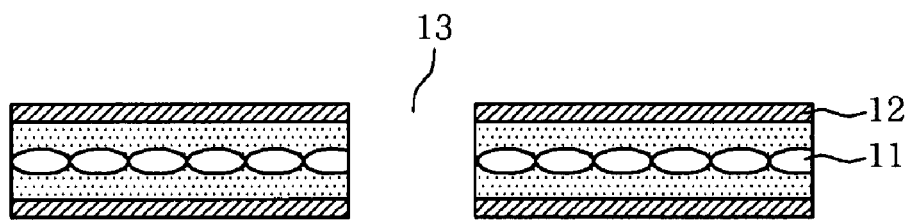
Figure 2C:
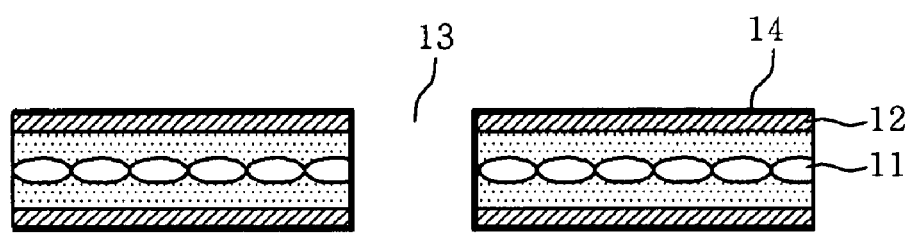
Figure 2D:
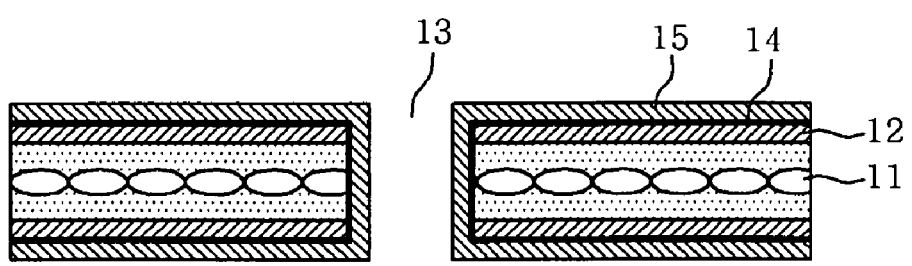
Figure 2E:
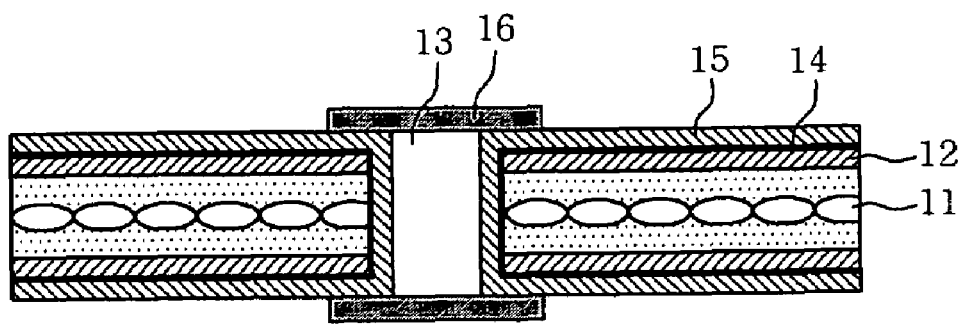
Figure 2F:
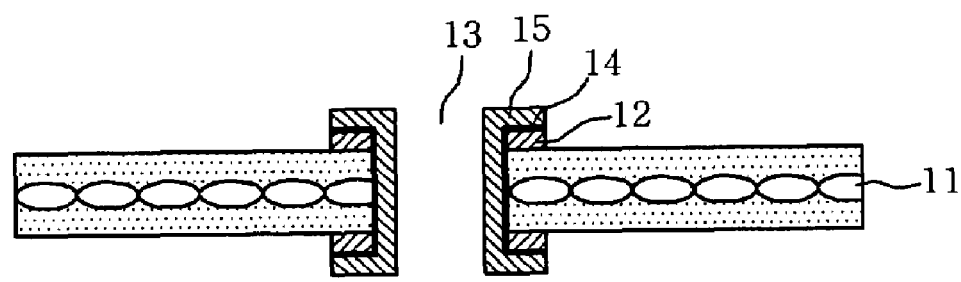
Figure 3:
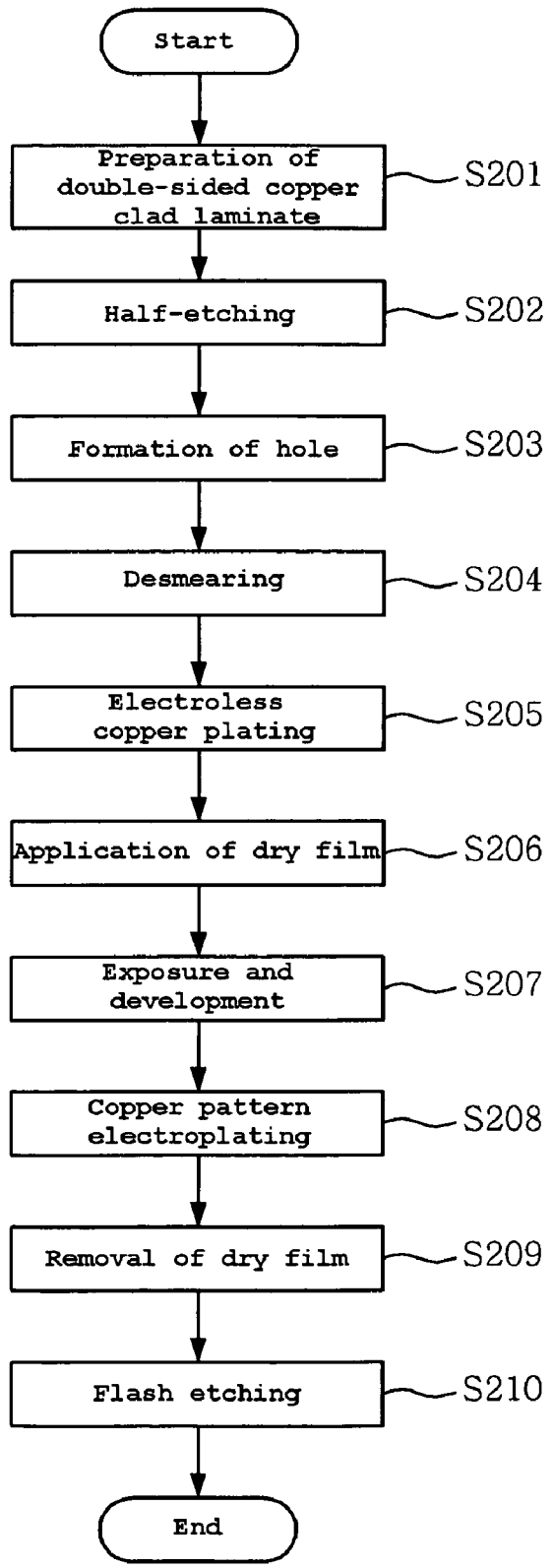
FIG. 3 is a flowchart schematically showing the process of manufacturing a PCB, according to a second conventional technique.
Figure 4A:
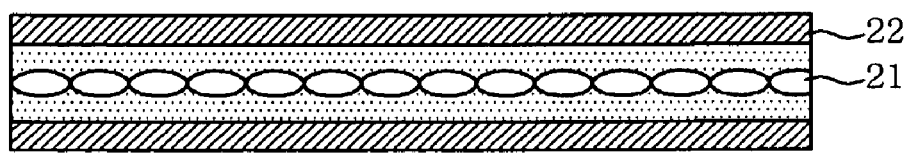
FIGS. 4A to 4F are schematic views sequentially showing the process of manufacturing the PCB according to the second conventional technique.
Figure 4B:
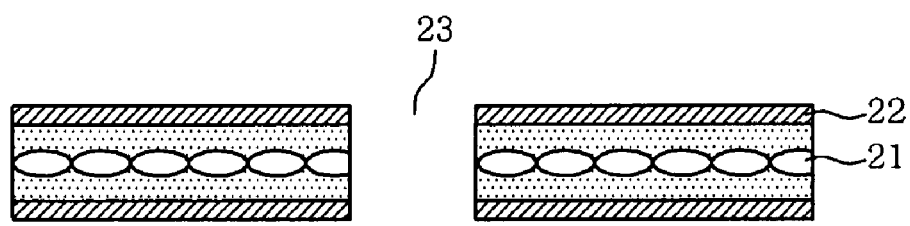
Figure 4C:
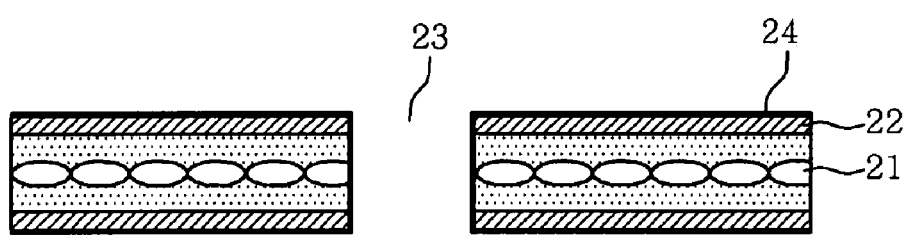
Figure 4D:
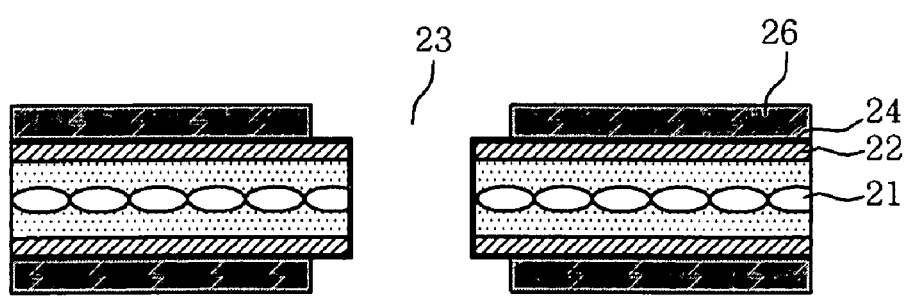
Figure 4E:
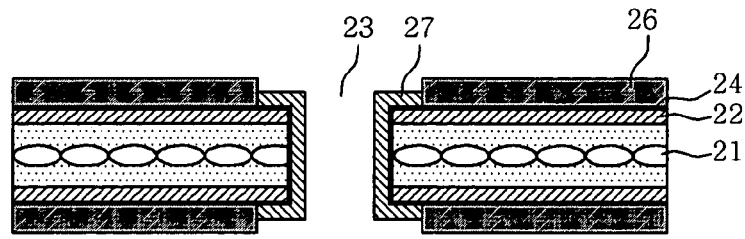
Figure 4F:
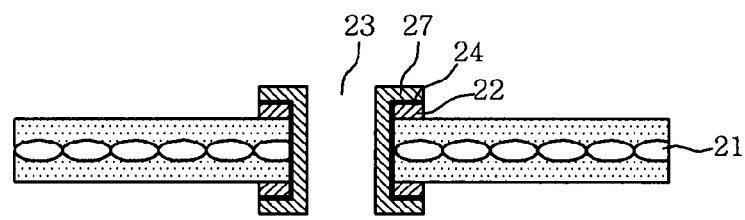
Figure 5:
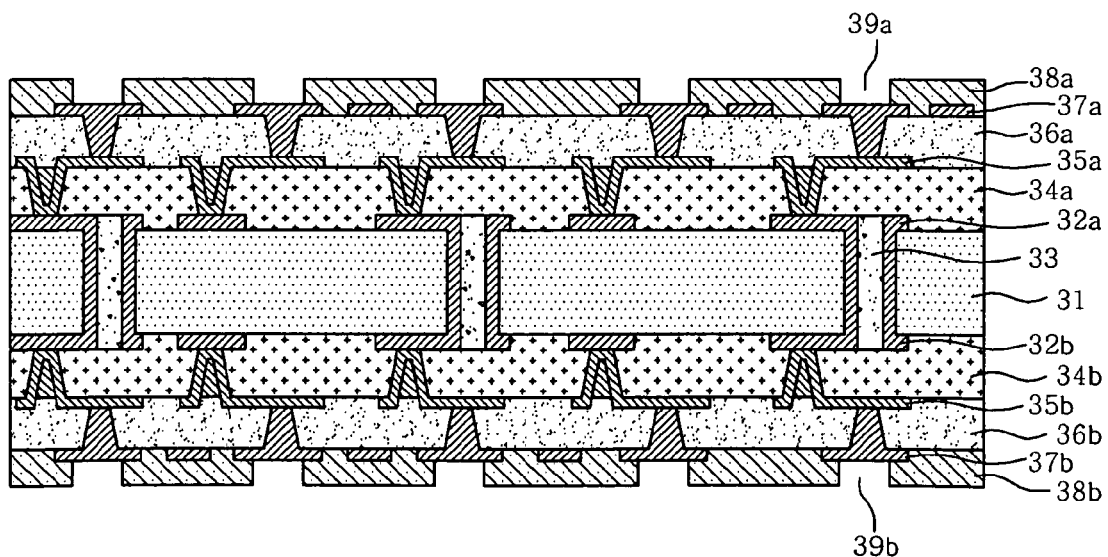
FIG. 5 is a cross-sectional view schematically showing the structure of a conventional FCBGA PCB.
Figure 6:
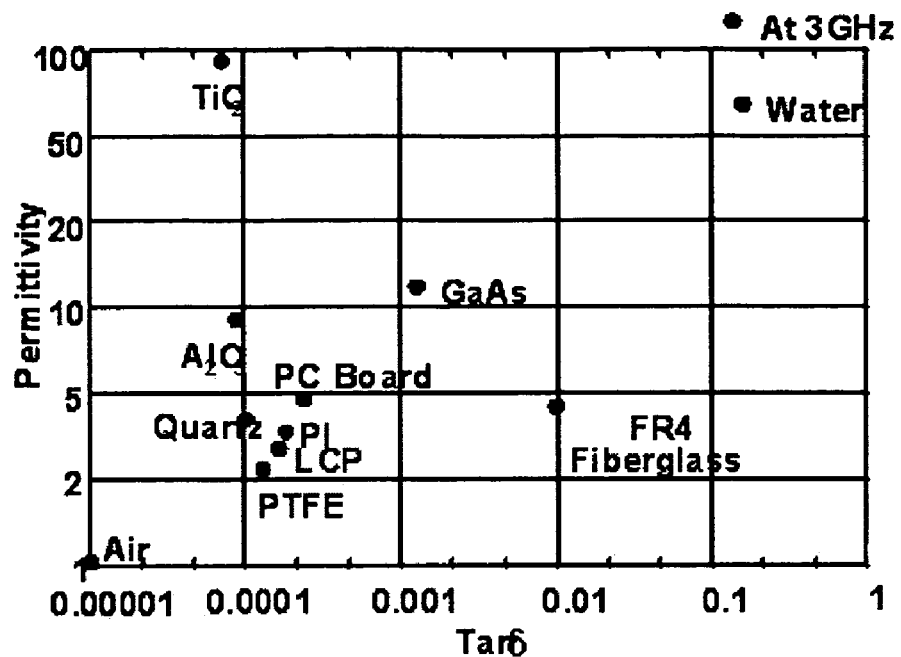
FIG. 6 is a graph showing the dielectric constant and loss properties of an insulating material for the PCB.
Figure 7:
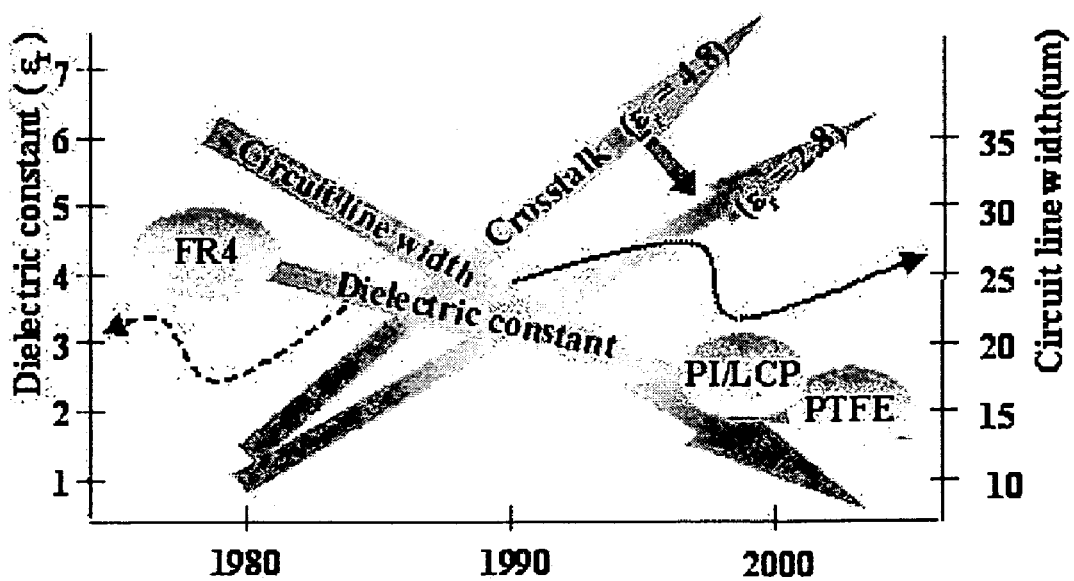
FIG. 7 is a graph showing the extent of development per year of the insulating material for the PCB.

For reference, the dielectric constant and loss properties of insulating material for use in a resin substrate for a PCB, and the extent of development per year thereof are shown in FIGS. 6 and 7, respectively. In addition, the dielectric constant and propagation delay speed of each insulating material are summarized in Table 1 below.

TABLE 1

| Insulating material | Dielectric Constant ($\epsilon_r$) | Propagation Delay (ps/in) |
|---|---|---|
| PTFE | 2.2 | 126 |
| LCP | 2.9 | 144 |
| PI | 3.5 | 158 |
| Cyanate Ester/Glass Fiber | 3.8 | 165 |
| Polyimide/Glass Fiber | 4.2 | 174 |
| FR4 | 4.5 | 180 |

As is apparent from Table 1, although SAP is conventionally applied to form a fine circuit instead of a subtractive process and MSAP, which lead to limited circuit fineness, it also has limitations on achieving a fine circuit due to the high surface roughness (e.g., >1 µm) of the insulating material. Further, in the conventional SAP, in order to assure adhesion between the insulating material and the electroless plating layer, the insulating material is subjected to a wet surface roughening process comprising desmearing treatment, that is, removing smears with permanganic acid, roughening the surface, and performing neutralization ($[CH_4+12MnO_4^-+14OH^-\rightarrow CO_3^{2-}+12MnO_4^{2-}+9H_2O+O_2]$) for removal of the remaining permanganic acid, to thus roughen a surface, and then to electroless plating to thus form a copper seed layer. In this way, the wet process suffers because it results in the generation of waste liquid and environmental problems.

However, in the present invention, while a wet surface roughening process is replaced with a dry ion beam surface treatment process, an electroless plating process is also replaced with a vacuum deposition process. Thereby, it is possible to realize a fine circuit with a minimum surface roughness (Ra<0.5 µm) through an environmentally friendly process.

Figure 8:
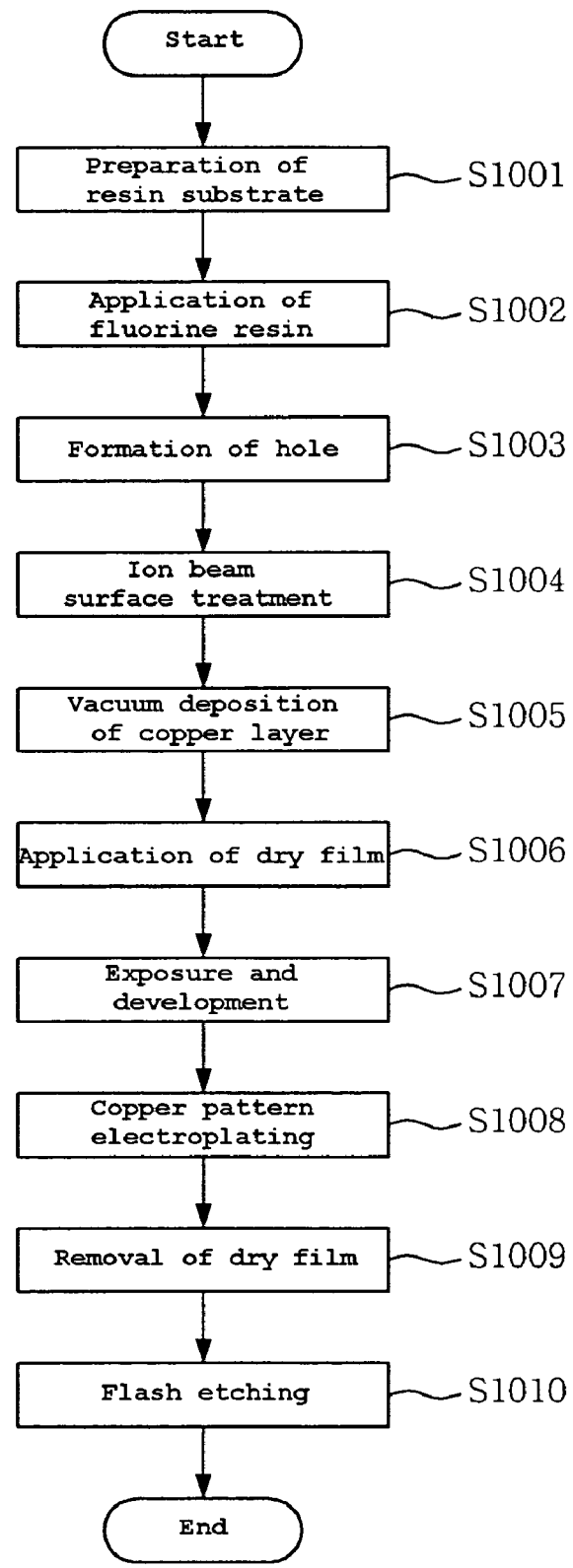
FIG. 8 is a flowchart schematically showing the process of manufacturing a PCB, according to the present invention.

In accordance with the preferred embodiment of the present invention, the process of manufacturing the PCB is shown in the flowchart of FIG. 8.

As shown in FIG. 8, the method of manufacturing the PCB according to the preferred embodiment of the present invention comprises providing a resin substrate (S1001), applying a fluorine resin (S1002), forming a hole (S1003), performing ion beam surface treatment (S1004), vacuum depositing a copper layer (S1005), applying a dry film (S1006), performing exposure and development (S1007), electroplating a pattern (S1008), removing the dry film (S1009), and performing flash etching (S1010).

Below, the process of manufacturing the PCB according to the preferred embodiment of the present invention is specifically described with reference to FIGS. 9A to 9I.

Figure 9A:
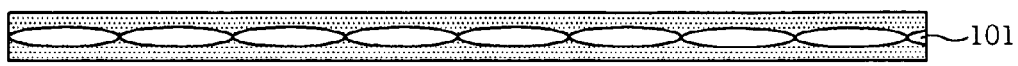
FIGS. 9A to 9I are schematic views sequentially showing the process of manufacturing the PCB, according to the present invention.

A resin substrate 101 composed of epoxy resin or fluorine resin, which is typically used for a PCB in the art, is prepared (FIG. 9A).

Figure 9B:
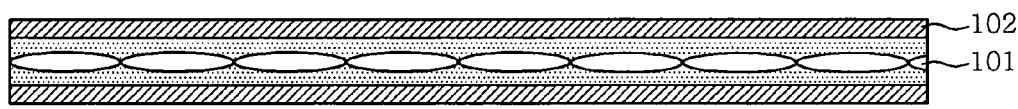
Figure 9C:
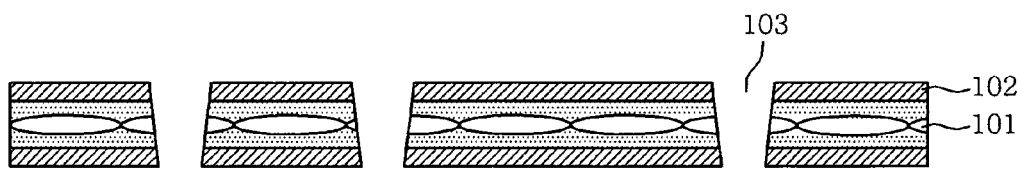

Subsequently, a fluorine resin coating layer 102 is formed on at least one surface of the resin substrate 101 using liquid fluorine resin (FIG. 9B).

Unlike the substrate material formed of fluorine resin, a conventional substrate material made of epoxy resin, such as FR-4, BT or ABF, has a poor ion beam surface treatment effect Hence, to alleviate such a problem, the present invention provides a technique for applying liquid fluorine resin on the surface of the epoxy material, heat treating it to thus modify the morphology of the surface into a type of fluorine resin, and surface treating the polymer using ion beams for enhancing the interfacial adhesion of the material. That is, the surface of the polymer is excited through the application of inert or reactive ions having energy to thus form an unstable ring, which is then chemically reacted with a reactive gas which is separately supplied, therefore forming a hydrophilic functional group on the surface of the polymer. Thereby, the hydrophobic properties of the material are changed to hydrophilic properties, desirably improving the ion beam surface treatment effect. As well, even though a substrate material is formed of some fluorine resins having poor ion beam surface treatment effects, it may have desired properties through a coating process using a fluorine resin having a good ion beam treatment effect.

Figure 10:
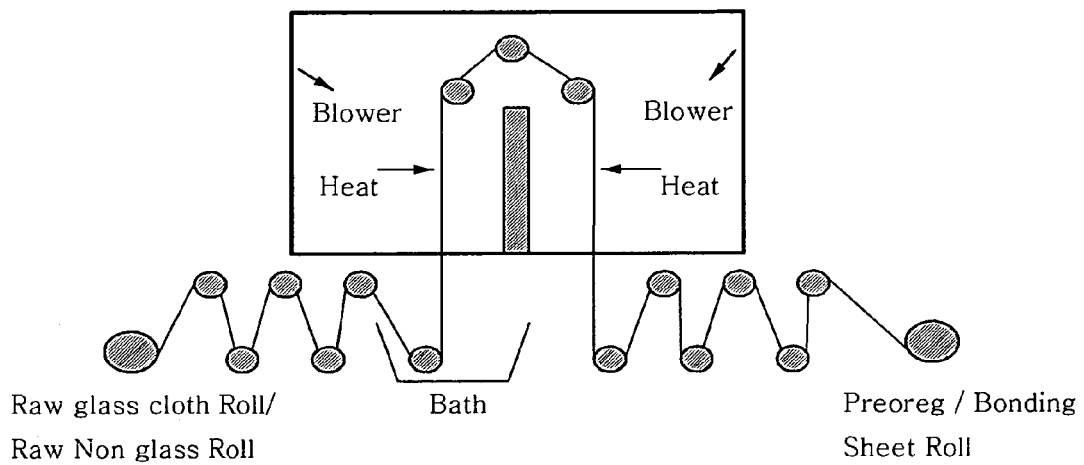
FIG. 10 is a schematic view showing the process of applying a fluorine resin, according to the present invention.

Examples of the fluorine resin used in the present invention include, but are not limited to, polytetrafluoroethylene (PTFE), polyimide (PI), liquid crystal polymer (LCP), thermoplastic polyimide (TPI), perfluoroalkoxy (PFA), fluorinated ethylene propylene (FEP), ethylene-tetrafluoroethylene (ETFE), polyvinylidene fluoride (PVDF), ethylene-chlorotrifluoroethylene (ECTFE), and polychlorotrifluoroethylene (PCTFE), which may be used alone or in combinations thereof. The procedure of forming the fluorine resin coating layer 102 on the resin substrate 101 using the liquid fluorine resin is described below with reference to FIG. 10. As such, it is noted that the present invention is not limited thereto, and any procedure may be applied as long as it is known in the art.

In the case where an insulating material is applied in a roll-to-roll manner (left side of FIG. 10), it is passed through an impregnation bath, as an impregnation machine, containing liquid fluorine resin, and is then subjected to a heat treatment process such that the material having either or both surfaces coated with the fluorine resin is heat treated at a temperature suitable for the fluorine resin used, and is thus cured. Further, in the case where an insulating material is applied in a sheet manner (right side of FIG. 10), it is coated with liquid fluorine resin using a screen and a roller and then cured through a heat treatment process.

Particularly, in the roll-to-roll manner, a material sample, which is loaded on a roll, is coated with a desired fluorine resin contained in the bath under appropriately controlled temperature and humidity conditions, and is then heat treated for control of the resin flow in a tower. Such an impregnation process is repeated one to ten times, thus obtaining the desired thickness, dielectric constant and loss coefficient of the insulating material.

In this way, through the application and heat treatment procedures, either or both surfaces of the resin substrate may be selectively impregnated with the fluorine resin. That is, in the case where the either surface thereof is impregnated, a release film (e.g., PET or PPE film) is attached to either surface of the material, and a coating process is performed, and then the release film is removed, whereby a desired fluorine resin may be applied only on any one surface. On the other hand, in the case of both surfaces, the material is dipped in the impregnation machine and the coating layer may be formed to a desired thickness through the control of the resin flow. Ultimately, through the above-mentioned procedures, a low dielectric constant and a low loss coefficient may result, and the substrate thus obtained may be used for lamination depending on the end use.

Specifically, in the sheet manner, a material sample is placed on a sheet, and desired liquid fluorine resin is pressed thereonto using a squeegee or a roller through screen printing, followed by performing heat treatment for control of the resin flow. Such an impregnation process is repeated one to ten times, therefore obtaining the desired thickness, low dielectric constant and low loss coefficient of the insulating material.

As such, in the fluorine resin application process, the application and heat treatment procedures are repeated one to ten times to adjust the dielectric constant, loss coefficient and thickness of the resin substrate. Thereby, desired properties of the insulating material may be obtained. Although the heat treatment temperature varies depending on the type of fluorine resin, the temperature required for curing the liquid fluorine resin generally falls in the range of 100~450° C.

Specifically, the conditions for application of the fluorine resin include 300~420° C. for PI, 350~420° C. for PTFE, 250~420° C. for LCP, 250~350° C. for TPI, and 150~250° C. for a bonding sheet, and humidity of <RH 50%. As the number of coating processes is increased, the dielectric constant is decreased and thus frequency properties are improved. However, in consideration of economic efficiency, the coating process is preferably performed one to ten times.

The thickness of the resulting fluorine resin coating layer may be appropriately controlled depending on the type of insulating material and fluorine resin to be applied thereon, and preferably ranges from 20 nm to 10 μm. That is, the dielectric constant of glass cloth is about 6.2 and the dielectric constant of epoxy or BT resin is about 3.5. With the goal of maintaining the strength of the material, the glass cloth is coated one to five times with the epoxy or BT resin so as to control the dielectric constant thereof to about 4.5. When the number of impregnation processes is increased, the dielectric constant is decreased.

For example, when the glass cloth (dielectric constant of 6.2) is impregnated with PTFE (dielectric constant of 2.1), its dielectric constant is adjusted to 2.2~4.0. As the number of coating processes is increased, the dielectric constant and the loss coefficient may be decreased to desired values. Through such a method, when the glass cloth, BT or epoxy is impregnated and coated with PTFE, PI, LCP, TPI, PFA, FEP, ETFE, or ECTFE, the dielectric constant and loss coefficient may be reduced. Further, upon one to ten repetitions of the above process, a desired dielectric constant and loss coefficient may be obtained.

Then, in the substrate having the fluorine resin coating layer 102, at least one through hole 103 for interlayer electrical connection is formed (FIG. 9C), and the surface of the substrate having the through hole 103 is treated using ion beams.

Preferably, the ion beam surface treatment process may be performed at an ion dose of 1E15~1E19 (ions/cm$^2$) in the presence of inert gas, selected from the group consisting of Ar, $O_2$, $N_2$, Xe, $CF_4$, $H_2$, Ne, Kr and mixtures thereof, but the present invention is not limited thereto. Although the ion dose varies depending on the type of material, PI, PTFE, LCP, TPI, bonding sheet, or fluorine resin preferably has an acceleration voltage of 0.5~20 KeV and an ion dose of 1E15~1E19 ions/cm$^2$.

Through such a dry ion beam surface treatment process, adhesion of the resin substrate to a subsequently formed copper seed layer is assured. That is, the surface of the polymer is excited through the application of inert or reactive ions having energy, to thus form an unstable ring, which is then chemically reacted with oxygen separately supplied as a reactive gas, therefore forming a hydrophilic functional group on the surface of the polymer. Without changing the surface roughness (Ra<0.5 μm), the interfacial adhesion of the material is enhanced, thus it is possible to realize a fine circuit.

Figure 9D:
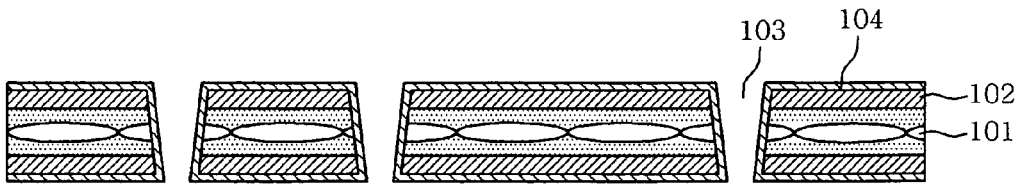
Figure 9E:
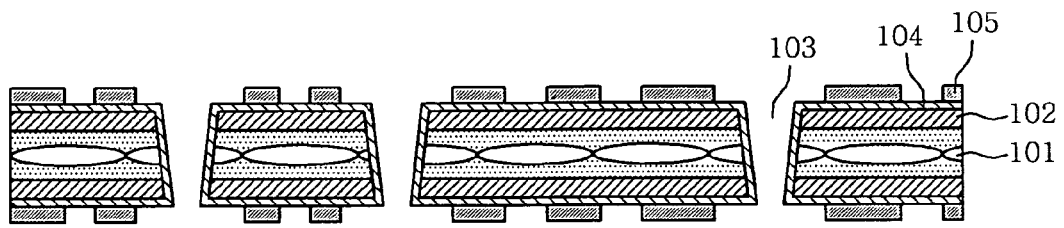

Subsequently, on the ion beam surface treated substrate, a copper seed layer 104 is formed to a desired thickness using a vacuum deposition process (FIG. 9D).

Examples of the vacuum deposition process include sputtering, thermal evaporation, and e-beam. As such, the present invention is not limited thereto, and any process may be used as long as it is known in the art.

The resultant copper seed layer preferably has a thickness from 20 nm to 4 μm. For reference, in conventional CZ treatment and electroless plating, a copper layer having a thickness of less then 3 μm is formed, and an SAP (Semi-Additive Process) is conducted.

In this way, for the formation of the copper seed layer, a conventional electroless plating process is replaced with a vacuum deposition process, thus a wet process is converted into a dry process, generating no waste liquid. Thereby, the process of the present invention is regarded as being environmentally friendly.

Figure 9F:
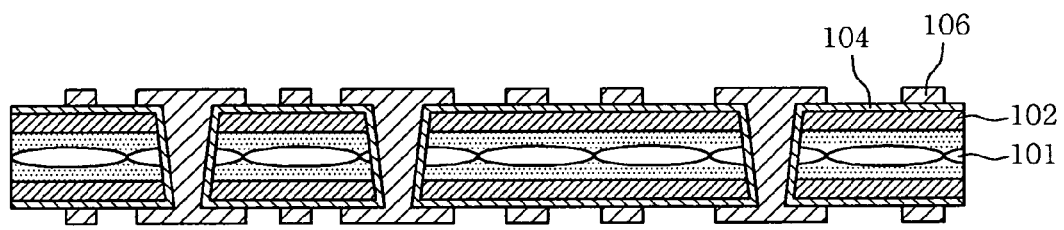

As known in the art, a dry film 105, acting as a plating resist, is applied on part of the copper seed layer other than a pattern plating layer (FIG. 9E), and a copper pattern is plated and then the dry film 105 is removed, forming a desired pattern plating layer 106 (FIG. 9F).

Figure 9G:
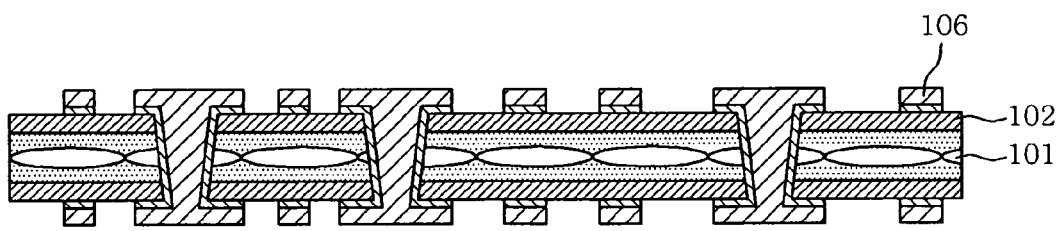

The part of the copper seed layer 104 on which the pattern plating layer 106 is not formed is removed using a typical flash etching process (FIG. 9G).

The PCB thus pattern plated may be formed into a multilayered PCB by repeating a lamination process and a circuit pattern forming process, depending on the end use.

Figure 9H:
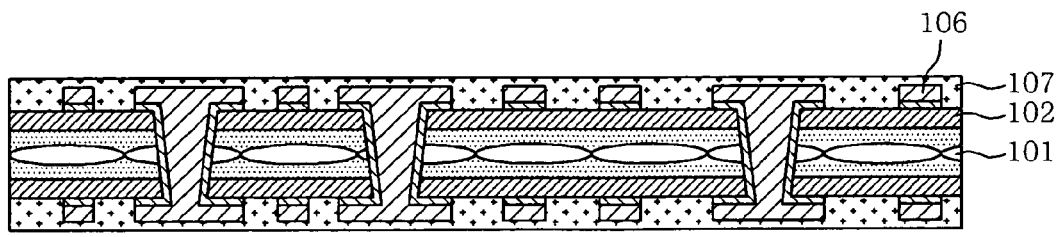
Figure 9I:
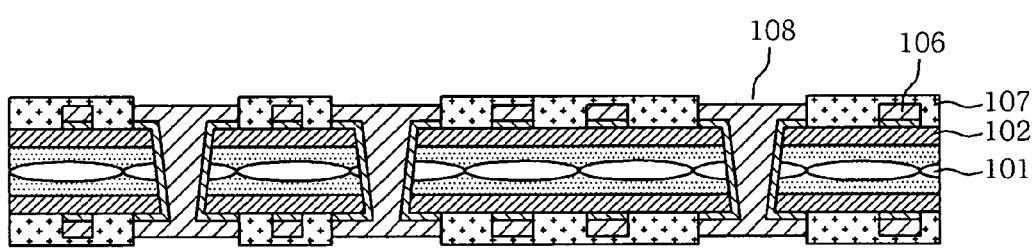

Selectively, as known in the art, as an outermost layer, a solder resist 107 may be applied, and a solder resist open part 108 may be formed through a typical solder resist opening process (FIGS. 9H and 9I).

Figure 11:
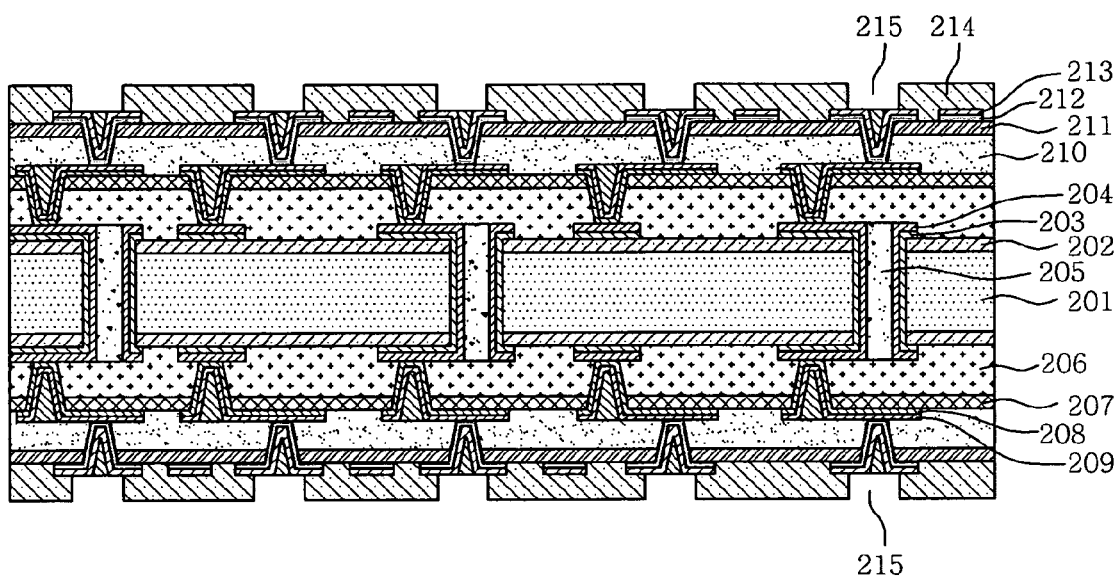
FIG. 11 is a cross-sectional view schematically showing the structure of the FCBGA PCB manufactured according to the present invention.

The example of FCBGA having a total of six layers, formed according to the above processes, is shown in FIG. 11.

As in FIG. 11, a core layer is composed of a first resin substrate 201 having fluorine resin coating layers 202 on both surfaces thereof, a first circuit layer formed thereon and including a copper deposition layer 203 and a pattern electroplating layer 204, and via holes 205 formed therein. Further, outer layers are composed of a set of a second resin substrate 206 having a fluorine resin coating layer 207 on one surface thereof, a second circuit layer including a copper deposition layer 208 and a pattern electroplating layer 209, and blind via holes, and a set of a third resin substrate 210 having a fluorine resin coating layer 211 on one surface thereof, a third circuit layer including a copper deposition layer 212 and a pattern electroplating layer 213, and blind via holes. Furthermore, as an outermost layer, a solder resist 214 is formed and a solder resist open part 215 is formed through a predetermined opening process.

Further, depending on the end use of such a built-up substrate, a process of building up the outer layer may be repeated several times, and a predetermined subsequent process may be additionally performed.

The PCB of the present invention may be applied to all products for realizing fine circuits, including HDI (high density interconnection) products, UT-CSP (ultra thin-chip scale package), BGA (ball grid array), and FCBGA (flip chip BGA), but the present invention is not limited thereto.

According to the present invention, the surface of the substrate coated with the fluorine resin is treated using ion beams, whereby adhesion (peel strength>1.0 Kgf/cm) to metal is increased without changing the surface roughness (Ra<0.5 μm), resulting in a fine circuit. Moreover, a conventional wet process is replaced with a dry process, thus the PCB may be manufactured in an environmentally friendly manner.

A better understanding of the present invention may be obtained through the following examples, which are set forth to illustrate, but are not to be construed as the limit of the present invention.

EXAMPLE 1

Both surfaces of a polyimide resin substrate, used as a base material, were coated several times with PTFE under conditions of a temperature of 350~420° C. and humidity of <RH 50%, thus forming a fluorine resin coating layer about 3 μm thick. Then, a via hole was formed about 40 μm deep in the substrate, after which the substrate was subjected to ion beam surface treatment using $N_2$ gas under conditions of an acceleration voltage of about 10 KeV and an ion dose of 2E17. Subsequently, on the surface treated substrate, a copper layer was deposited to a thickness of about 2 μm using DC sputtering and ion beam sputtering. Finally, a pattern plating process was performed such that a via hole 40 μm deep was filled and a copper pattern plating layer having a thickness of 15 μm was formed.

The peel strength and surface roughness of the PCB thus manufactured were measured. The results are shown in Table 2 below.

EXAMPLE 2

Both surfaces of a polyimide resin substrate, used as a base material, were coated several times with TPI under conditions of a temperature of 250~350° C. and humidity of <RH 50%, thus forming a fluorine resin coating layer about 3 μm thick. Then, a via hole was formed about 40 μm deep in the substrate, after which the substrate was subjected to ion beam surface treatment using $N_2$ gas under conditions of an acceleration voltage of about 10 KeV and an ion dose of 2E17. Subsequently, on the surface treated substrate, a copper layer was deposited to a thickness of about 2 μm using DC sputtering and ion beam sputtering. Finally, a pattern plating process was performed such that a via hole 40 μm deep was filled and a copper pattern plating layer having a thickness of 15 μm was formed.

The peel strength and surface roughness of the PCB thus manufactured were measured. The results are shown in Table 2 below.

COMPARATIVE EXAMPLE 1

An epoxy resin substrate was subjected to desmearing treatment and then electroless plating using an electroless plating solution (available from ATOTECH), thus forming a copper seed layer about 3 μm thick. Then, through a copper electroplating process using a copper electroplating solution (available from EVARA), a via hole 40 μm deep was filled and a copper pattern layer 15 μm thick was formed.

The peel strength and surface roughness of the PCB thus manufactured were measured. The results are shown in Table 2 below.

TABLE 2

|  | Ex. 1 | Ex. 2 | C. Ex. 1 |
| --- | --- | --- | --- |
| Peel Strength | 1.5 kgf/cm | 1.7 kgf/cm | 0.8 kgf/cm |
| Surface Roughness | 0.3 μm | 0.4 μm | 2.0 μm |

As is apparent from Table 2, the conventional substrate (Comparative Example 1) manufactured using a wet process had peel strength of about 0.7~0.9 kgf/cm and a surface roughness greater than 1.0 μm, leading to a pitch (line/space=18/18 μm). However, the substrate (Example 1) manufactured using a dry process according to the present invention had a peel strength of about 1.0~2.0 kgf/cm and a surface roughness of less than 0.5 μm, thus realizing a fine circuit having a finer pitch (line/space=10/10 μm) and a faster signal transfer rate.

As described hereinbefore, the present invention provides a PCB and a method of manufacturing the same. According to the present invention, a base material is subjected to a fluorine resin application process and then to an ion beam surface treatment process, and thus the interfacial adhesion thereof is increased without changing the surface roughness. Further, due to the impregnation of the fluorine resin, a low dielectric constant and a low loss coefficient may be realized, increasing a signal transfer rate and minimizing a loss coefficient upon data transfer.

Furthermore, although a conventional substrate has a surface roughness (Ra) greater than 1.0 μm, a minimum surface roughness (Ra) of less than 0.5 μm may be achieved through ion beam surface treatment, therefore realizing a fine circuit.

Moreover, a copper seed layer is formed using a vacuum deposition process as a dry process instead of a conventional wet process, such as an electroless plating process, thus a PCB may be manufactured in an environmentally friendly manner.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A printed circuit board, comprising:
a resin substrate for the printed circuit board;
a fluorine resin coating layer formed on at least one surface of the resin substrate;
a via hole formed in a predetermined position of the substrate coated with the fluorine resin;
a copper seed layer formed on a surface of the substrate having the via hole through ion beam surface treatment and vacuum deposition; and
a copper pattern plating layer formed on part of the substrate having the copper seed layer and formed in the via hole.

2. The printed circuit board as set forth in claim 1, wherein the fluorine resin is selected from the group consisting of polytetrafluoroethylene, fluorinated ethylene propylene, perfluoroalkoxy, ethylene-tetrafluoroethylene, polyvinylidene fluoride, ethylene-chlorotrifluoroethylene, polychlorotrifluoroethylene, and combinations thereof.

3. The printed circuit board as set forth in claim 1, wherein the fluorine resin coating layer has a thickness from 20 nm to 10 μm.

4. The printed circuit board as set forth in claim 1, wherein the copper seed layer has a thickness from 20 nm to 4 μm.

5. The printed circuit board as set forth in claim 1, wherein the resin substrate is a substrate composed of epoxy resin or fluorine resin.

* * * * *